United States Patent
Tsuchida

(10) Patent No.: US 6,788,128 B2
(45) Date of Patent: Sep. 7, 2004

(54) OVERCURRENT PROTECTION STRUCTURE OF LOAD DRIVING CIRCUIT

(75) Inventor: Masahiro Tsuchida, Aichi-ken (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/413,090

(22) Filed: Apr. 14, 2003

(65) Prior Publication Data

US 2003/0197532 A1 Oct. 23, 2003

(30) Foreign Application Priority Data

Apr. 19, 2002 (JP) ........................................ 2002-117655

(51) Int. Cl.[7] .............................................. H03B 1/00
(52) U.S. Cl. ........................ 327/427; 327/434; 327/309
(58) Field of Search ............................... 327/108, 309, 327/312, 427, 434, 437; 361/86–87, 91.5, 91.6, 93.7, 93.9

(56) References Cited

U.S. PATENT DOCUMENTS

| | | | |
|---|---|---|---|
| 5,361,008 A | * 11/1994 | Saijo | 327/427 |
| 5,432,471 A | 7/1995 | Majumdar et al. | 327/380 |
| 5,642,252 A | * 6/1997 | Sakamoto et al. | 361/93.9 |
| 5,801,573 A | * 9/1998 | Kelly et al. | 327/434 |
| 6,181,186 B1 | * 1/2001 | Itoh et al. | 327/309 |
| 6,218,889 B1 | * 4/2001 | Fujiki et al. | 327/427 |
| 6,269,011 B1 | * 7/2001 | Ohshima | 363/50 |
| 6,313,690 B1 | * 11/2001 | Ohshima | 327/427 |
| 6,377,428 B1 | * 4/2002 | Ogasawara | 361/86 |

FOREIGN PATENT DOCUMENTS

| | | |
|---|---|---|
| JP | 5-218836 | 8/1993 |
| JP | 5-61432 | 3/1994 |
| JP | 8-12921 | 2/1996 |
| JP | 8-54427 | 2/1996 |
| JP | 3032745 | 2/2000 |
| JP | 3164065 | 3/2001 |

* cited by examiner

Primary Examiner—My-Trang Nuton
(74) Attorney, Agent, or Firm—Harness, Dickey & Pierce, PLC

(57) ABSTRACT

An electrical load driving circuit is provided which includes an insulated gate transistor and a control voltage limiting circuit. The transistor works to supply the power to an electrical load selectively. The control voltage limiting circuit includes a control circuit and a switching circuit. The control circuit works to limit a voltage applied to the transistor selectively to one of a higher controlled voltage and a lower controlled voltage. The switching circuit is disposed across the transistor and closed selectively to limit the voltage applied to the transistor to the second controlled voltage through the control circuit when it is determined that an overcurrent has occurred which flows through the transistor.

6 Claims, 6 Drawing Sheets

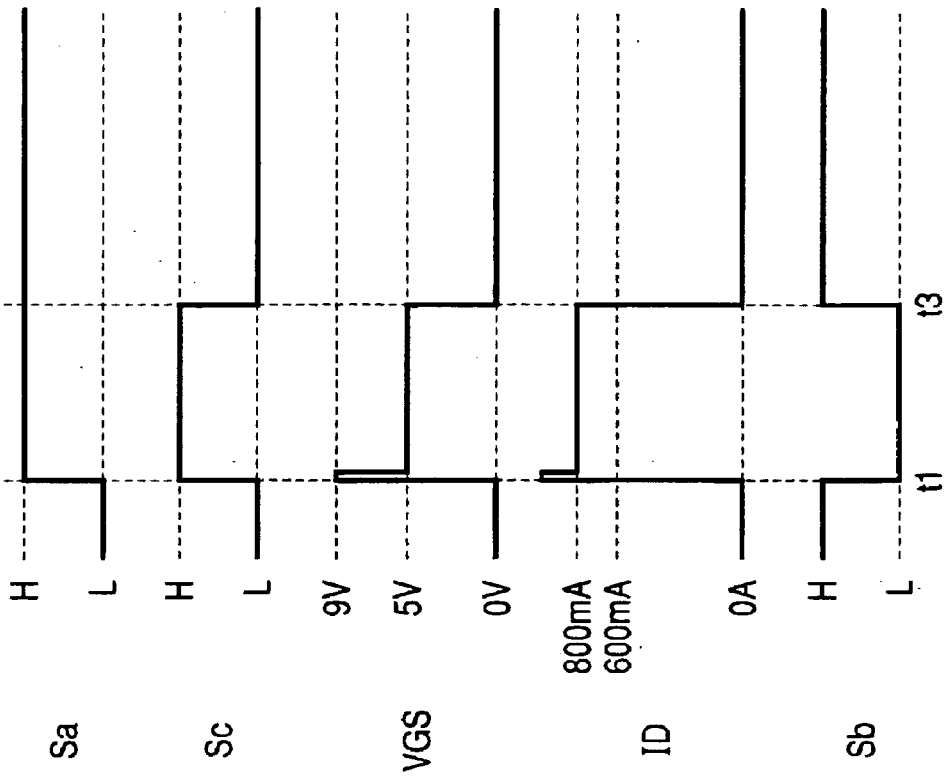
FIG. 2(a) LOAD IS OPERATING NORMALLY
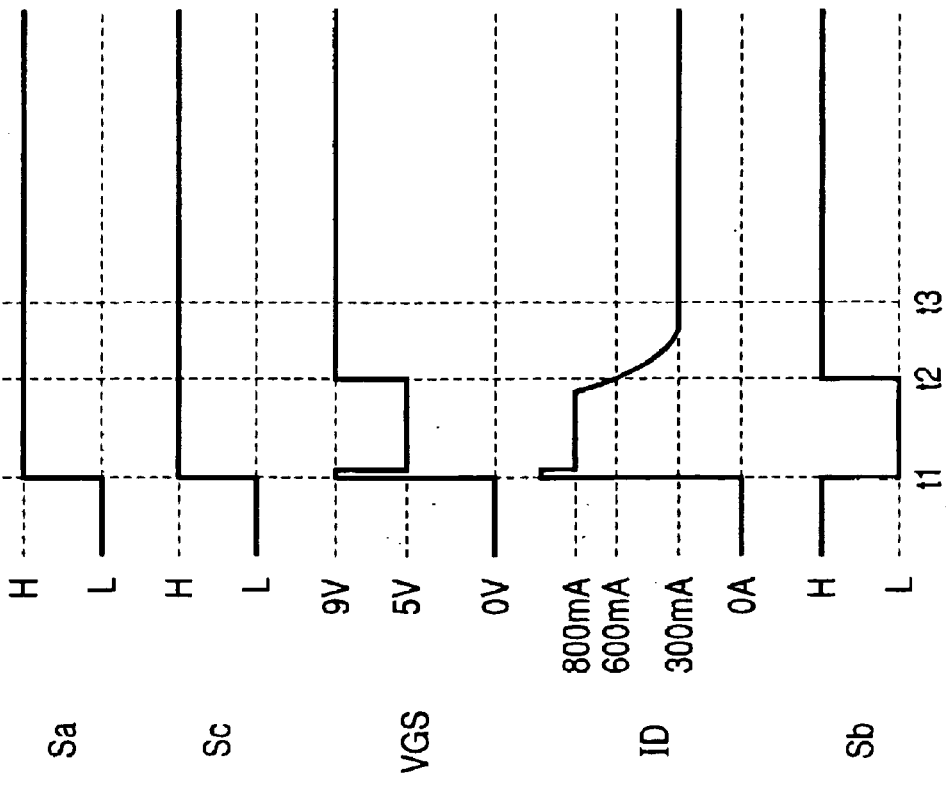
FIG. 2(b) LOAD IS MALFUNCTIONING

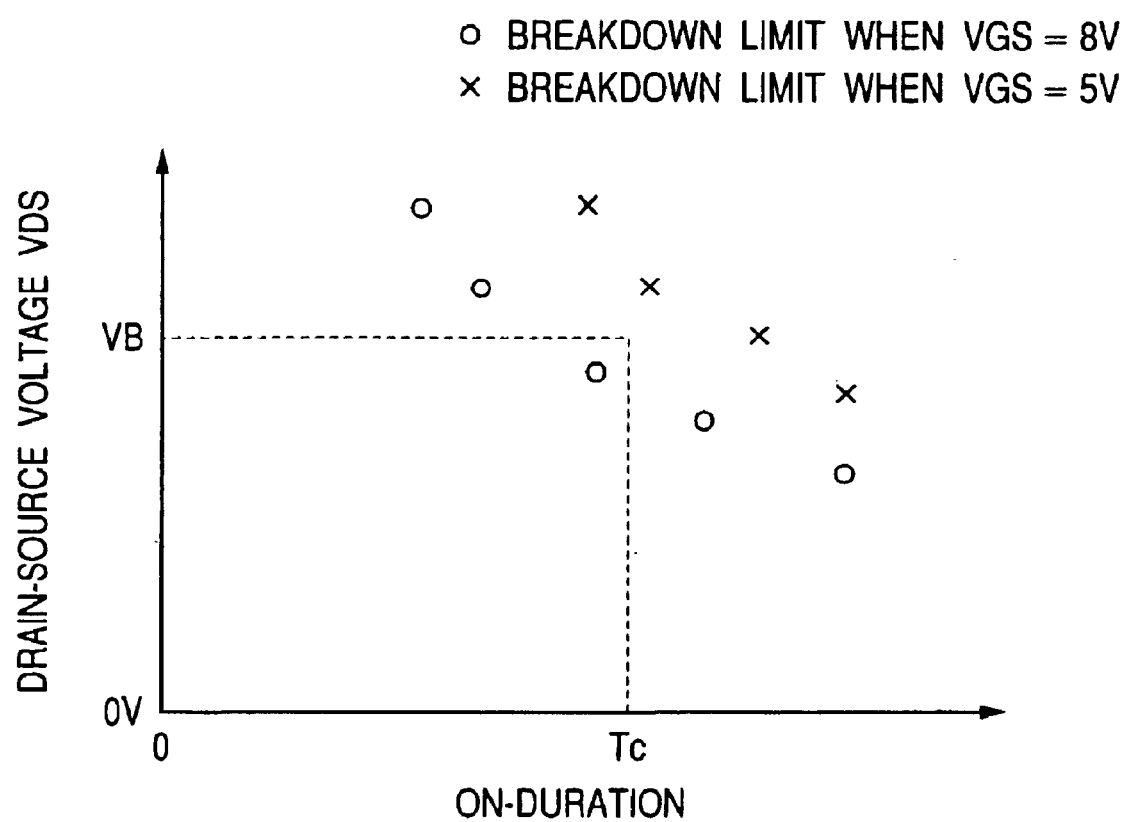

OVERCURRENT PROTECTION STRUCTURE OF LOAD DRIVING CIRCUIT

BACKGROUND OF THE INVENTION

1. Technical Field of the Invention

The present invention relates generally to a load driving circuit designed to drive a current flowing through an electrical load using an insulated gate transistor, and more particularly to an overcurrent protection structure of such a load driving circuit equipped with with an overcurrent detector and an overcurrent limiter.

2. Background Art

FIG. 6 shows an example of an electric structure of a conventional load driving circuit equipped with MOSFETs.

The load driving circuit 1 is fabricated on a control IC installed in, for example, an electronic control unit (ECU) of automotive vehicles and works to drive an electrical load 3 such as a relay coil or an LED disposed between an output terminal 1a of the IC and a battery 2.

Disposed between the output terminal 1a and a ground terminal 1b are an FET4 through which a main current flows and an FET 5 working to measure the current. A resistor 6 is connected between the FET 5 and the ground terminal 1b. The FETs 4 and 5 connect at gates thereof to each other. Zener diodes 7 and 8 are connected to the gates of the FETs 4 and 7 in an illustrated orientation. The load driving circuit 1 also includes an operational amplifier 9 which works to control the voltage at the gates of the FETs 4 and 5 as a function of a difference between the voltage developed across ends of the resistor 6 and a reference voltage (i.e., a threshold current).

The zener diodes 7 and 8 work to protect the gates of the FETs 4 and 5 from an overvoltage. If a condition that an unusual rise in voltage of the battery 2 or a drop in impedance of the load 2 will cause an overcurrent exceeding the threshold current to flow is encountered, the operational amplifier 9 serves to bring the current into agreement with the threshold current to protect the FET 4 from the overcurrent. An output of the operational amplifier 9 is used as an overcurrent detection signal.

A static charge may be added to the output terminal 1a or the ground terminal 1b through a line extending from the battery 2 to the load 3. In order to avoid this, an external ESD (electrostatic discharge) protective capacitor 10 is joined between the output terminal 1a and the ground terminal 1b to enhance the ability of the load driving circuit 1 to withstand the ESD. The addition of the capacitor 10, however, causes all charge stored in the capacitor 10 to be released through the FET 4 when the FET 4 is switched from an on-state to an off-state, so that an excessive discharged current flows in the load driving circuit 1, which causes the operational amplifier 9 to output the overcurrent detection signal in error. Specifically, the system is responsive to the covercurrent detection signal outputted from the operational amplifier 9 to determine in error that the overcurrent is flowing through the load driving circuit 1.

SUMMARY OF THE INVENTION

It is therefore a principal object of the invention to avoid the disadvantages of the prior art.

It is another object of the invention to provide a load driving circuit designed to increase the accuracy of detecting an overcurrent flow arising from an unusual condition of an electrical load or a power supply and/or to protect circuit components from the overcurrent.

According to one aspect of the invention, there is provided an electrical load driving circuit which may be employed in an electronic control unit for automotive vehicles. The electrical load driving circuit comprises: (a) an insulated gate transistor installed in an electrical line extending between a power supply and an electrical load, the insulated gate transistor working to output a current as a function of a control voltage applied across a control terminal and a first terminal thereof; (b) a current measuring circuit working to measure a current flowing through the insulated gate transistor; (c) a control voltage limiting circuit disposed between the control terminal and the first terminal, the control voltage limiting circuit including a control circuit which and a switching circuit, the control circuit working to limit a voltage developed across the control and first terminals selectively to one of a first controlled voltage and a second controlled voltage lower in level than the first controlled voltage, the switching circuit being disposed between the control terminal and the first terminal and closed in response to input of a close control signal to establish electric communication between the control terminal and the first terminal to limit the voltage developed across the control and first terminals to the second controlled voltage through the control circuit; and (d) a comparator working to compare the current as measured by the current measuring circuit with a threshold current that is selected within a given current range smaller than a maximum current allowed to flow through the insulated gate transistor. When the measured current is greater than the threshold current, the comparator provides the close control signal to close the switching circuit of the second control voltage limiting circuit.

Specifically, when the current flowing through the insulated gate transistor exceeds the threshold current, the comparator works to close the switching circuit to limit the voltage developed across the control terminal and the first terminal of the insulated gate transistor to the second controlled voltage. The current flowing through the insulated gate transistor limited by the second controlled voltage (i.e., a saturation current in a case where the insulated gate transistor is a MOSFET) is greater than the threshold current and does not affect the transistor undesirably. The electrical load driving circuit works to detect occurrence of the overcurrent based on a difference between those currents to protect the transistor from the overcurrent.

In the preferred mode of the invention, the electrical load driving circuit further comprises an overcurrent determining circuit which works to provide an overcurent signal indicating occurrence of the overcurrent when the comparator continues to output the close control signal after the elapse of a given period of time from output of the close control signal from the comparator. This enables the overcurrent which results from a malfunction of the load or a power supply to be detected accurately. Specifically, the overcurrent determining circuit determines the occurrence of overcurrent only when the covercurrent resulting from the malfunction of the load or the power supply continues to flow.

A capacitive load is further provided which is joined between the first terminal and a second terminal of the insulated gate transistor. The overcurrent determining circuit is designed to make a decision to output the overcurrent signal after a time has been reached which is required to release a charge from the capacitive load.

The electrical load driving circuit may also include a turn-off circuit which turns off the insulated gate transistor in response to output of the overcurrent signal from the overcurrent determining circuit, thereby avoiding breakage of the insulated gate transistor.

The current measuring circuit includes a measuring transistor which connects at a control terminal thereof with the control terminal of the insulated gate transistor and has a given cell ratio between itself and the insulated gate transistor and a measuring resistor working to measure the current flowing through the measuring transistor. This permits the current provided by the cell ratio to flow through the insulated gate transistor.

The electronic load driving circuit may further comprise an electrostatic discharge protective capacitor disposed between the first terminal and the second terminal of the insulated gate transistor.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings:

FIG. 2(a) is a time chart which shows an operation of the electrical load driving circuit of FIG. 1 when an electrical load is in service;

FIG. 2(b) is a time chart which shows an operation of the electrical load driving circuit of FIG. 1 when an electrical load is malfunctioning;

FIG. 3 is a graph which shows a relation between a drain-source voltage of an FET 26 and an ON-duration of the FET 26;

DESCRIPTION OF THE PREFERRED EMBODIMENTS

Figure 1:
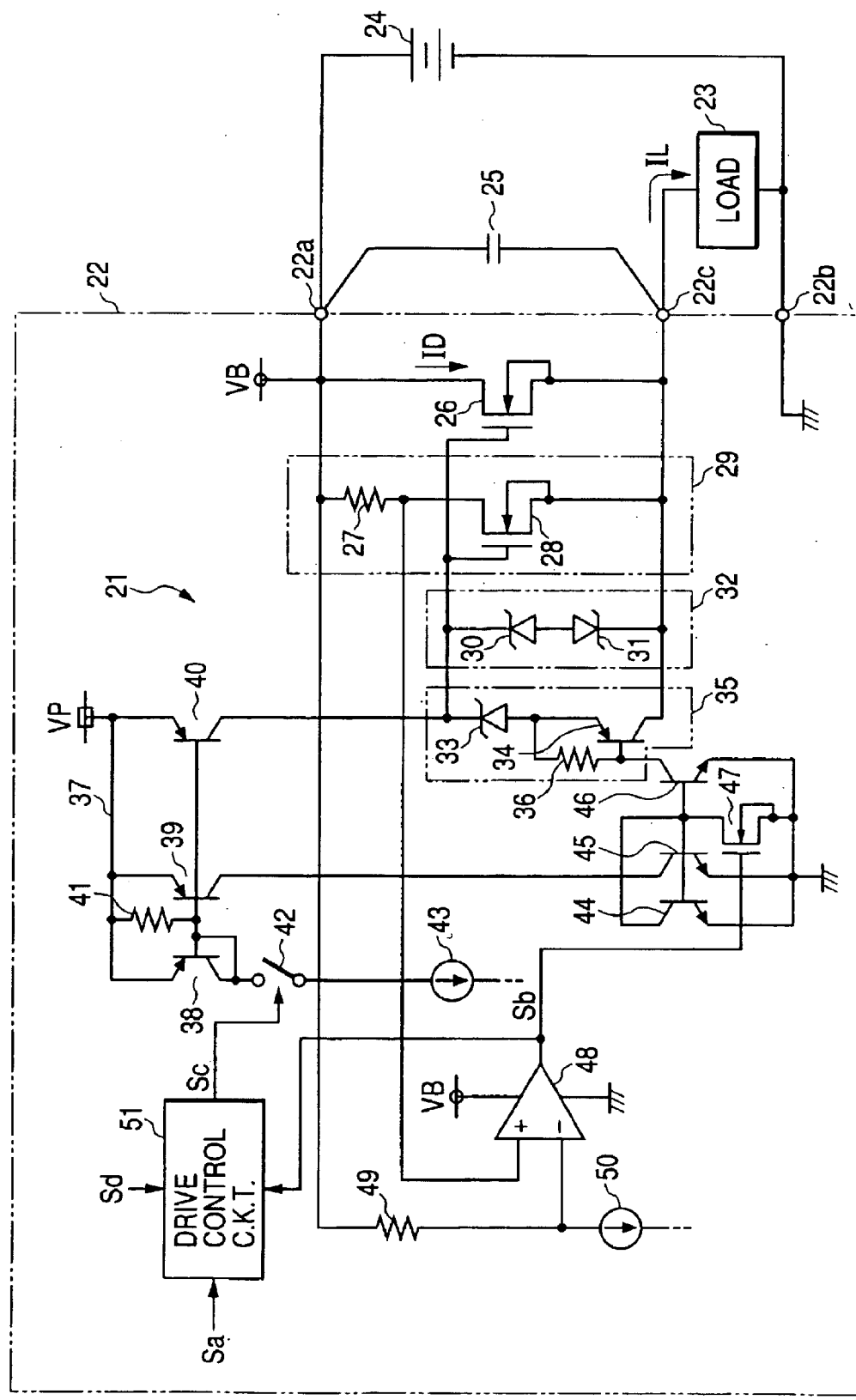
FIG. 1 is a circuit diagram which shows an electrical load driving circuit according to the first embodiment of the invention.

Referring to the drawings, wherein like reference numbers refer to like parts in several views, particularly to FIG. 1, there is shown a load driving circuit 21 according to the first embodiment of the invention which is fabricated on an IC 22 installed in an ECU (Electronic Control Unit) of an automotive vehicle and works to drive a resistive and inductive electrical load 23 such as a relay coil or an LED. In practice, the IC 22 has disposed thereon as many channels, i.e., driving circuits 21 as electrical loads to be actuated.

The IC 22 has a power supply terminal 22a and a ground terminal 22b connected to positive and negative terminals of a battery 24, respectively. The electrical load 23 is connected between an output terminal 22c and the ground terminal 22b of the IC 22. An external capacitor 25 (i.e., a capacitive load) is disposed between the power supply terminal 22a and the output terminal 22c for enhancing the ability of the IC 22 to withstand ESD (electrostatic discharge).

The load driving circuit 21 has disposed between the power supply terminal 22a and the output terminal 22c an N-channel MOSFET 26 (i.e., an insulated gate transistor) and a current detector 29 made up of a resistor 27 and an N-channel MOSFET 28 connected in series which works as a high-side switch for the load 23.

The FETs 26 and 28 connect at gates and sources thereof to each other. The number of cells indicative of a drain area and a source area of the FET 28 is one-hundredth (1/100) of that of the FET 26, so that a drain current of the FET 28 is one-hundredths (1/100) of a drain current ID of the FET 26. The driving circuit 21 is designed to develop the voltage across ends of the resistor 27 which is in the order of 0.1V when the drain current ID is a rated load current (e.g., 300 mA), thus resulting in a greatly decreased shift in a current ratio arising from a difference in drain-source voltage between the FETs 26 and 28.

The driving circuit 21 also has a first control voltage limiter 32 and a second control voltage limiter 35 disposed between the gates and sources of the FETs 26 and 28. The first control voltage limiter 32 consists of zener diodes 30 and 31 connected in series to have opposite polarities. The second control voltage limiter 35 consists of a zener diode 33 and a PNP transistor 34 connected in series. A resistor 36 is interposed between an emitter and a base of the transistor 34.

The zener voltage of the zener diodes 30 and 31 is set to, for example, 8V. The control voltage limiter 32 works to limit a gate-source voltage VGS (will be referred to as a gate voltage VGS below) of the FETs 26 and 28 to approximately 9V or less. The zener voltage of the zener diode 33 is set to, for example, 5V. The second control voltage limiter 35 works to limit the gate voltage VGS to 5V or less when the transistor 34 is turned on.

The IC 22 also has disposed therein a charge pump circuit (not shown) which steps up the voltage VB (i.e., the battery voltage) appearing at the terminal 22a to produce the voltage VP. The driving circuit 21 also includes a current mirror circuit made up of transistors 38, 39, and 40 and a resistor 41. The transistors 38, 39, and 40 are connected at emitters to a power supply step-up line 37 and at bases to each other. The transistor 38 is connected at a collector thereof to a constant current circuit 43 through a switch 42. The transistor 40 is connected at a collector thereof to the gates of the FETs 26 and 28.

Transistors 44 and 45 are disposed in parallel to each other between the collector of the transistor 39 and the ground terminal 22b. A transistor 46 is disposed between the base of the transistor 34 and the ground terminal 22b. The transistors 44, 45, and 46 form a current mirror circuit. A MOSFET 47 is disposed between a line leading to the bases of the transistors 44, 45, and 46 and the ground terminal 22b. The FET 47 connects at a gate thereof to an output terminal of the comparator 48.

The comparator 48 works to compare the current as measured by the current detector 29 with a threshold current. The power supply terminal 22a connects with the constant current circuit 50 through the resistor 49. The comparator 48 connects at an inverting input thereof with a junction between the resistor 49 and the constant current circuit 50 and at a non-inverting input thereof with a junction between the resistor 27 and the drain of the FET 28. The voltage developed across the ends of the resistor 49 is inputted to the comparator 48 as the threshold current.

The load driving circuit 21 also includes a drive control circuit 51 which work as an overcurrent detector. The drive control circuit 51 receives a drive command signal Sa provided by a control circuit (not shown) and a comparison signal Sb that is an output of the comparator 48 and outputs a drive enable signal Sc to the switch 42. The drive control circuit 51 is equipped with a counter which counts the number of oscillating signals Sd produced by a CR oscillator (not shown). If the comparison signal Sb is in a high level at the time when the value counted by the counter has reached a given value following switching of the comparison signal Sb from the high to low level, the drive control circuit 51 outputs the drive enable signal Sc of the high level to close the switch 42. Alternatively, if the comparison signal Sb is in the low level, the drive control circuit 51 outputs the drive enable signal Sc of the low level (indicative of detection of overcurrent) to open the switch 42.

The operation of the load driving circuit 21 will be described below in detail with reference to FIGS. 2(*a*), 2(*b*), and 3.

FIG. 2(*a*) illustrates for a case where the load 23 is in service and has a normal electrical resistance. FIG. 2(*b*) illustrates for a case where the resistance of the load 23 is decreased considerably due to, for example, a short circuit.

In the case illustrated in FIG. 2(*a*), the drive control circuit 51 is responsive to the drive command signal Sa switched from the low (on-signal) to high level (off-signal) at time t1 to change the drive enable signal Sc from the low to high level. This causes the switch 42 to be turned on, so that the current flows from the power supply step-up line 37 to the transistor 40 and the control voltage limiter 32, thereby causing the gate voltage VGS to be elevated to approximately 9V to turn on the FET 26.

When the FET 26 is turned on, the ESD protection capacitor 25 is short-circuited, so that the current is discharged from the capacitor 25 to the FET 26. The discharged current is higher than the threshold current (e.g., 600 mA), so that the comparator 48 changes its output (i.e., the comparison signal Sb) from the high to low level. Thus, the transistor 47 is turned off, while the transistors 44, 45, 46, and 34 are turned on, so that the control voltage limiter 35 is turned on instead of the control voltage limiter 32, thereby limiting the gate voltage VGS to 5V.

The limiting of the gate voltage VGS causes the drain current ID of the FET 26 to be limited to a maximum current which is allowed to pass therethrough as a function of the gate voltage VGS, i.e., saturation current (e.g., 800 mA). Note that the gate voltage VGS (5V) in such a case is so selected that the saturation current of the FET 26 may be greater than the threshold current, thereby protecting the FET 26 from a short-circuit current of the capacitor 25.

When the current discharged from the capacitor 25 decreases below the threshold current at time t2, the comparator 48 changes the comparison signal Sb from the low to high level. Afterwards, the drain current ID of the FET 26 decreases to a load current IL (e.g., 300 mA). The drive control circuit 51 starts the counting operation when the comparison signal Sb has changed from the high to low level. At time t3 when a given count value has reached, the comparison signal Sb is in the high level, so that the drive control circuit 51 holds the drive enable signal Sc at the high level.

If the load 23 is short-circuited or the voltage VB rises undesirably during operation of the load 23, so that the drain current ID of the FET 26 exceeds the threshold current, the gate voltage VGS is limited to 5V until the drain current ID decreases below the threshold current. Simultaneously, the drive control circuit 51 starts the counting operation again and determines whether the overcurrent has occurred or not as a function of the level of the comparison signal Sb upon completion of the counting operation.

In the case, as illustrated in FIG. 2(*b*), where the resistance of the load 23 is decreased greatly, when the FET 26 is turned on, it will cause an excessive load current IL to flow through the FET 26 in addition to the current discharged from the capacitor 25. Thus, the gate voltage VGS is, like the case of FIG. 2(*a*), limited to 5V, to limit the drain current ID of the FET 26.

The excessive load current IL, however, still continues to flow through the FET 26 after the current discharged from the capacitor 25 decreases, so that the comparison signal Sb is kept at the low level. Since the comparison signal Sb is placed at the low level indicating that an overcurrent is flowing at time t3, the drive control circuit 51 determines that the overcurrent continues to flow which is caused by some factor different from that leading to a temporal overcurrent flowing from the capacitor 25 and changes the drive enable signal Sc from the high to low level to disenable the FET 26. This prohibits the FET 26 from being driven while the load 23 is short-circuited, thereby protecting the FET 26 from an unusual rise in temperature or damage thereof.

The constant value to be counted up by the drive control circuit 51 from occurrence of the overcurrent is selected based on the electric capacitance of the capacitor 25, the voltage VB, an on-resistance of the FET 26, a cycle of the oscillating signal Sd, and/or variations thereof. Specifically, the counting time Tc (=t3–t1) is set longer than the time Td (=t2–t1) during which the capacitor 25 is discharged in a case where the load 23 is in service, and the voltage VB is normal.

The gate voltage VGS limited by the control voltage limiter 35 is selected based on the counting time Tc, the voltage VB, and withstand ability of the FET 26 so that, as described above, that the saturation current of FET 26 may be greater than the threshold current. FIG. 3 shows the withstand ability of the FET 26. The abscissa axis indicates the time during which the FET 26 is turned on. The ordinate axis indicates the drain-source voltage VDS of the FET 26. "○" and "X" denote a breakdown limit in events that the gate voltage VGS is 8V and 5V, respectively. The graph shows that when the drain-source voltage VDS is identical with the voltage VB, and the FET 26 is kept on during the counting time Tc, it exceeds the breakdown limit in the case where the gate voltage VGS is 8V. The gate voltage VGS is, therefore, set to 5V that is out of a breakdown range.

As apparent form the above discussion, the two control voltage limiters 32 and 35 having the different voltage limits are disposed between the gate and source of the FET 26 working to supply or cut the load current IL selectively. The comparator 48 provides the comparison signal Sb of the low level to turn on the second control voltage limiter 35 when the drain current ID exceeds the threshold current, resulting in the flow of overcurrent. This causes the gate voltage VGS to be limited to 5V to decrease the drain current ID to protect the FET 26 from breakage.

The drive control circuit 51 stops driving the FET 26 only when the overcurrent is still flowing after a lapse of the counting time Tc from occurrence of the overcurrent. This prevents the FET 26 from being disenabled in error which may be caused by a temporal flow of overcurrent discharged from the ESD protection capacitor 25 disposed between the terminals 22*a* and 22*c* of the IC 22. Specifically, the drive control circuit 51 is capable of tracing a cause of the overcurrent, that is, determining whether the overcurrent now flowing is caused by the electrical discharge from the capacitor 25 or a malfunction of the load 23 or the power supply (i.e., the battery 24). The same is true for a case there the load 23 is capacitive.

The counting time Tc of the drive control circuit 51 is, as described above, selected to be longer than the time required for the current discharged from the capacitor 25 to decrease below the threshold current, thereby improving the reliability of the above overcurrent decision. The gate voltage VGS limited by the control voltage limiter 35 is so selected as to avoid the breakage of the FET 26 even if all the voltage VB of the battery 24 is applied across the drain and source of the FET 26, and the FET 26 continues to be turned on for the counting time Tc, thereby ensuring the protection of the FET 26 from the overcurrent.

Figure 6:
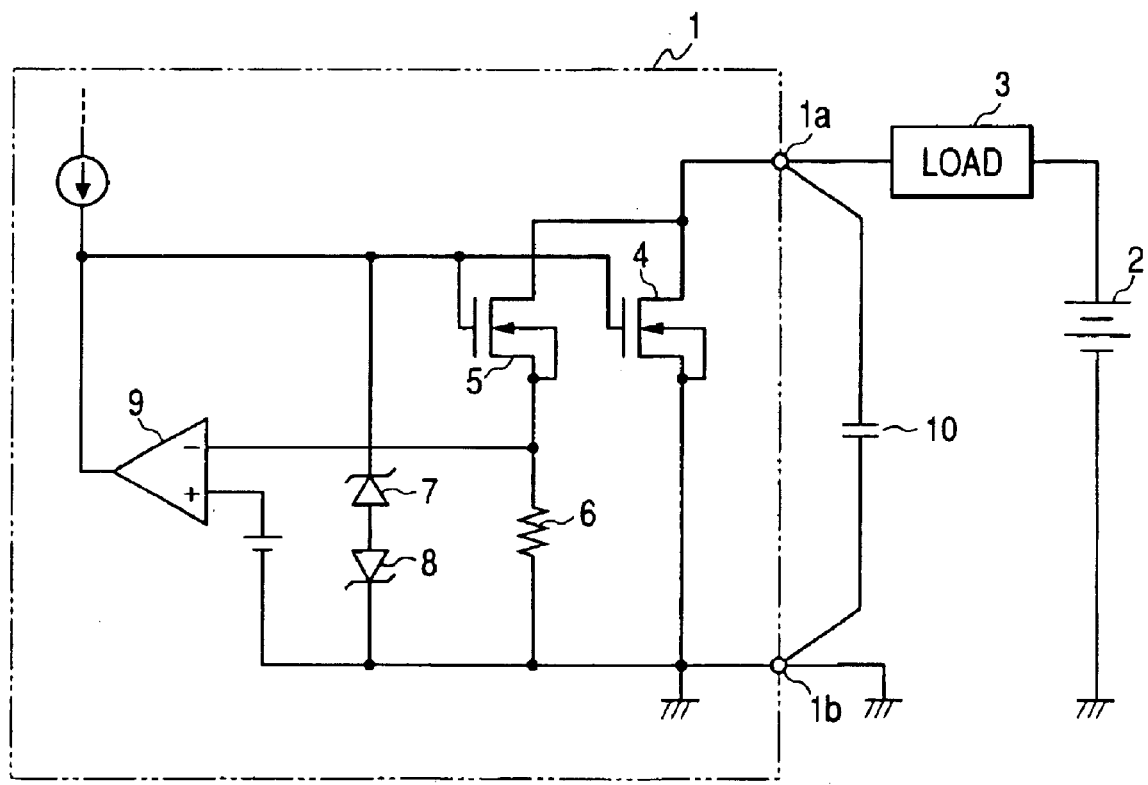
FIG. 6 is a circuit diagram which shows an example of a conventional electrical load driving circuit.

The load driving circuit 21 does not work to bring the drain current ID of the FET 26 into agreement with a constant value during flow of the overcurrent under feedback control, but limits the gate voltage VGS to a constant value under open-loop control, thus eliminating the need for an operational amplifier required in the conventional structure as illustrated in FIG. 6. This results in a decrease in chip area or production cost required to fabricate a multi-channel circuit is fabricated on the IC 22.

Figure 4:
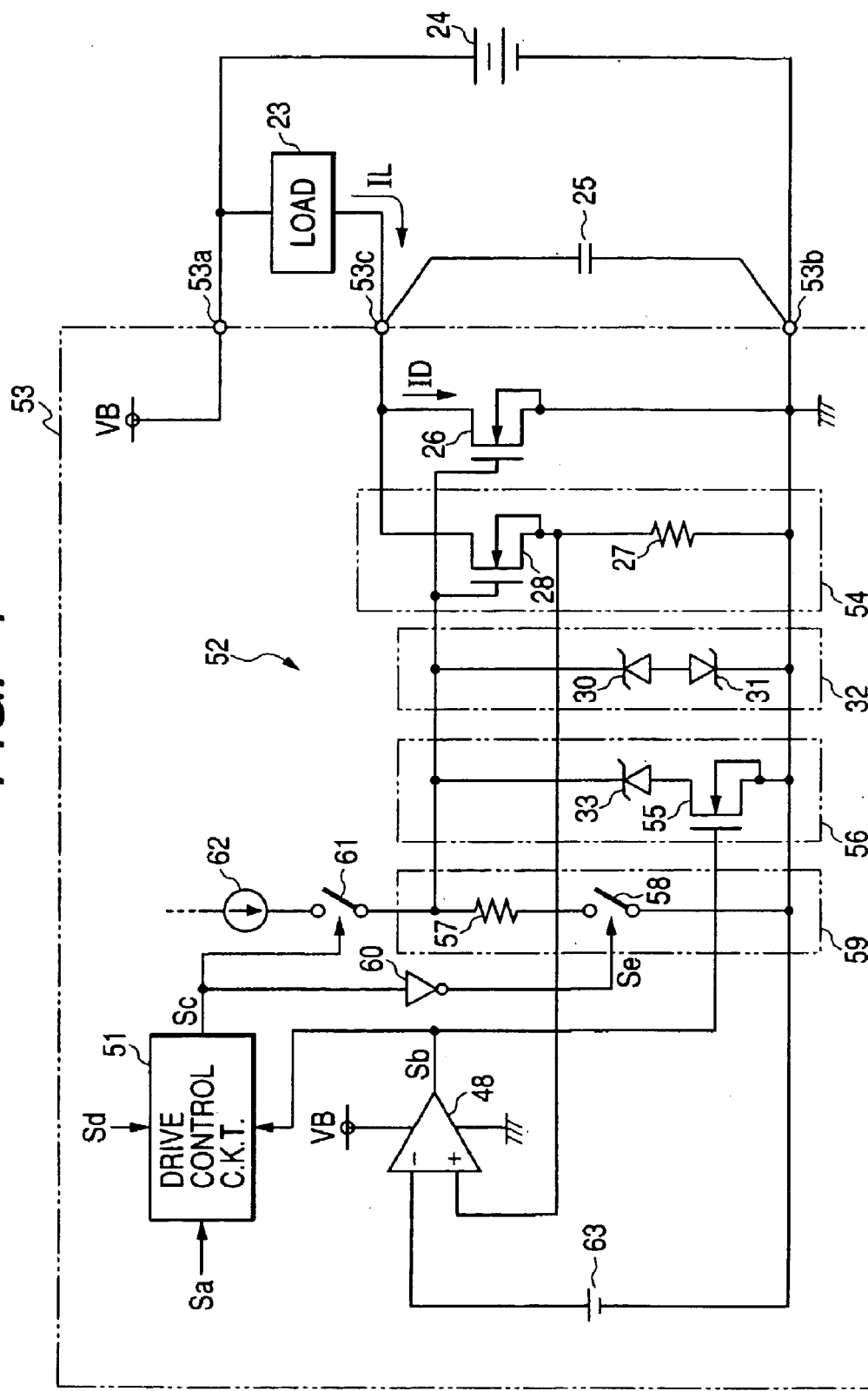
FIG. 4 is a circuit diagram which shows an electrical load driving circuit according to the second embodiment of the invention.

FIG. 4 shows a load driving circuit 52 according to the second embodiment of the invention. The same reference numbers as those in FIG. 1 will refer to the same parts, and explanation thereof in detail will be omitted here.

The load driving circuit 52 is fabricated on the IC 53 at a low side of the electrical load 23. The battery 24 is connected between a power supply terminal 53a and a ground terminal 53b of the IC 53. The load 23 is connected between the power supply terminal 53a and an output terminal 53c. The capacitor 25 is connected between the output terminal 53c and the ground terminal 53b.

The load driving circuit 52 also has a current detector 54 and the FET 26 disposed between the output terminal 53c and the ground terminal 53b. The current detector 54 consists of the FET 28 and the resistor 27 connected in series. The second control voltage limiter 56 made up of a zener diode 33 and an N-channel MOSFET 55 connected in series is disposed between the gates and sources of the FETs 26 and 28. An off-drive circuit 59 made up of a resistor 57 and a switch 58 connected in series is disposed between the gates and sources of the FETs 26 and 28.

The switch 58 is designed to be turned on or off selectively in response to a drive disenable signal Se produced by inverting the drive enable signal Sc outputted by the drive control circuit 51 through an inverter 60. Specifically, the switch 58 is turned on when the drive disenable signal Se is in the high level, while it is turned off when the drive disenable signal Se is in the low level. The FETs 26 and 28 are joined at the gates thereof to a constant current circuit 62 through a switch 61. The switch 61 is turned on or off by the drive enable signal Sc. The switch 61 and the off-drive circuit 59 work as a cut-off circuit.

The comparator 48 connects at an inverting input with a reference voltage generating circuit 63 and at a non-inverting input with a junction between the source of the FET 28 and the resistor 27. The reference voltage generating circuit 63 works to provide a reference voltage (i.e., the threshold current) to the comparator 48. The load driving circuit 52 is constructed as a low-side switch, thus eliminating the need for a charge pump circuit.

In operation, when the drive enable signal Sc is switched to the high level, the switch 58 is turned off, while the switch 61 is turned on. Alternatively, when the drive enable signal Sc is switched to the low level, the switch 58 is turned on, while the switch 61 is turned off. When the switch 58 is turned on, it will cause gate charges of the FETs 26 and 28 to decrease rapidly through the resistor 57, thereby shortening the time required for turning of the FETs 26 and 28. The load driving circuit 52 and other components are identical in operation with those in the first embodiment, and explanation thereof will be omitted here.

Figure 5A:
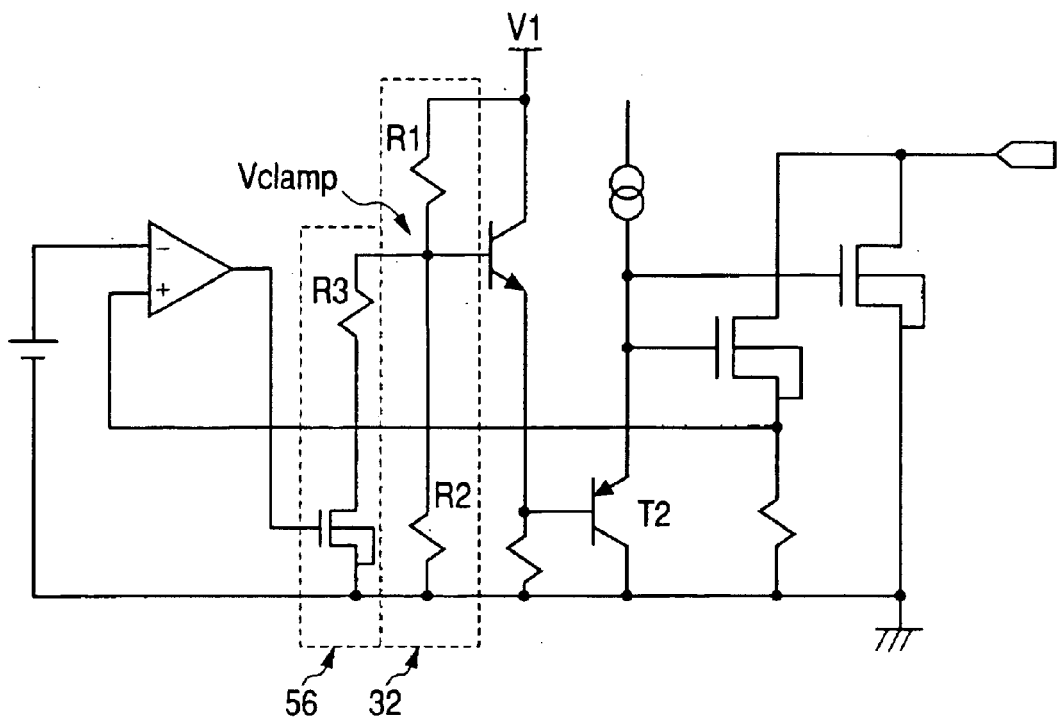
FIGS. 5(a) and 5(b) are circuit diagrams which show modification of the second embodiment.
Figure 5B:
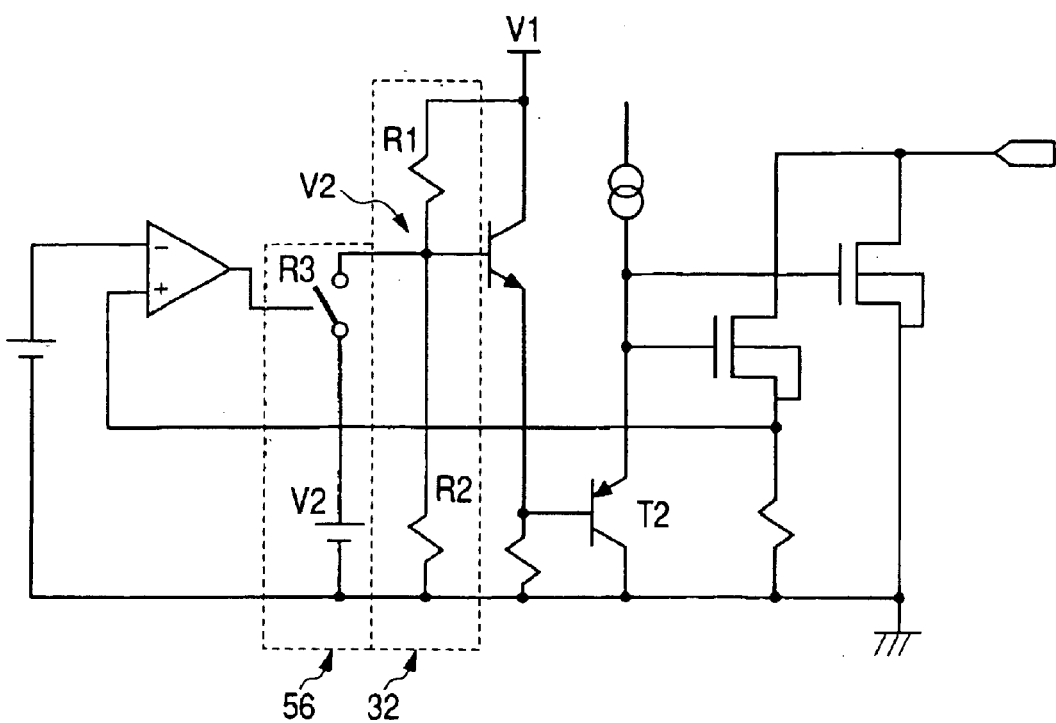

FIGS. 5(a) and 5(b) show modifications of the load driving circuit 52 of the second embodiment in which a clamping value is determined as a function of the voltage Vclamp (i.e., parameters R1, R2, and R3). The drive control circuit 51 is omitted for the brevity of illustration. The resistor R3 may be replaced with a power supply.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments witch can be embodied without departing from the principle of the invention as set forth in the appended claims.

For example, the first control voltage limiter 32 and the zener diode 33 may be replaced with a multi-diode circuit made up of diodes connected in series or a resistor. In case of the resistor, the voltage limit is determined by an output current of the constant current circuit 43 or 62 and the resistance value of the resistor. It is, thus, advisable that the value of the constant current and the resistance value be determined with high accuracy.

In each of the embodiments, the first voltage limit is set to approximately 9V, but it may be determined as a function of a permissible value of voltage developed across the gates and sources of the FETs 26 and 28.

The off-drive circuit 59 which is controlled by the drive disenable signal Sc may also be disposed between the gates and sources of the FETs 26 and 28 in the first embodiment.

Instead of the current detectors 29 and 54, a current detecting resistor may be connected to the drain or source of the FET 26.

An insulated gate bipolar transistor (IGBT) may be used which serves to output the current to the load 23.

What is claimed is:

1. An electrical load driving circuit comprising:

an insulated gate transistor installed in an electrical line extending between a power supply and an electrical load, said insulated gate transistor working to output a current as a function of a control voltage applied across a control terminal and a first terminal thereof;

a current measuring circuit working to measure a current flowing through said insulated gate transistor;

a control voltage limiting circuit disposed between the control terminal and the first terminal, said control voltage limiting circuit including a control circuit and a switching circuit, the control circuit working to limit a voltage developed across the control and first terminals selectively to one of a first controlled voltage and a second controlled voltage lower in level than the first controlled voltage, the switching circuit being disposed between the control terminal and the first terminal and closed in response to input of a close control signal to establish electric communication between the control terminal and the first terminal to limit the voltage developed across the control and first terminals to the second controlled voltage through the control circuit; and a comparator working to compare the current as measured by said current measuring circuit with a threshold current that is selected within a given current range smaller than a maximum current allowed to flow through said insulated gate transistor, when the measured current is greater than the threshold current, said comparator providing the close control signal to close the switching circuit of said control voltage limiting circuit.

2. The electrical load driving circuit as set forth in claim 1 further comprising an overcurrent determining circuit working to provide an overcurent signal indicating occurrence of an overcurrent when said comparator continues to output the close control signal after the elapse of a given period of time from output of the close control signal from said comparator.

3. The electrical load driving circuit as set forth in claim 2, further comprising a capacitive load joined between the first terminal and a second terminal of said insulated gate transistor, and wherein said overcurrent determining circuit is designed to make a decision to output the overcurrent signal after a time has been reached which is required to release a charge from the capacitive load.

4. The electrical load driving circuit as set forth in claim 2, further comprising a turn-off circuit which turns off said insulated gate transistor in response to output of the overcurrent signal from said overcurrent determining circuit.

5. The electrical load driving circuit as set forth in claim 1, wherein said current measuring circuit includes a measuring transistor which connects at a control terminal thereof with the control terminal of said insulated gate transistor and has a given cell ratio between itself and said insulated gate transistor and a measuring resistor working to measure the current flowing through the measuring transistor.

6. The electrical load driving circuit as set forth in claim 1, further comprising an electrostatic discharge protective capacitor disposed between the first terminal and a second terminal of said insulated gate transistor.

* * * * *

UNITED STATES PATENT AND TRADEMARK OFFICE
CERTIFICATE OF CORRECTION

PATENT NO. : 6,788,128 B2
DATED : September 7, 2004
INVENTOR(S) : Masahiro Tsuchida It is certified that error appears in the above-identified patent and that said Letters Patent is hereby corrected as shown below:

<u>Title page,</u>
Item [56], References Cited, FOREIGN PATENT DOCUMENTS, reads "JP 5-61432" should be -- JP 6-61432 --

<u>Column 9,</u>
Line 10, "overcurent" should be -- overcurrent --

Signed and Sealed this

First Day of February, 2005

JON W. DUDAS
*Director of the United States Patent and Trademark Office*